United States Patent
Ha et al.

(10) Patent No.: US 10,505,498 B2
(45) Date of Patent: Dec. 10, 2019

(54) ENVELOPE TRACKING BIAS CIRCUIT AND POWER AMPLIFYING DEVICE

(71) Applicant: Samsung Electro-Mechanics Co., Ltd., Suwon-si (KR)

(72) Inventors: Jong Ok Ha, Suwon-si (KR); Jeong Hoon Kim, Suwon-si (KR); Byeong Hak Jo, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/993,971

(22) Filed: May 31, 2018

(65) Prior Publication Data
US 2019/0123689 A1    Apr. 25, 2019

(30) Foreign Application Priority Data

Oct. 24, 2017 (KR) .......................... 10-2017-0138695
Dec. 22, 2017 (KR) .......................... 10-2017-0178413

(51) Int. Cl.
*H03F 3/60* (2006.01)
*H03F 1/02* (2006.01)
*H03F 3/24* (2006.01)

(52) U.S. Cl.
CPC ........... *H03F 1/0227* (2013.01); *H03F 3/245* (2013.01); *H03F 2200/102* (2013.01); *H03F 2200/451* (2013.01)

(58) Field of Classification Search
CPC ..... H04B 5/0031; H04B 5/0075; H04W 4/80; H01Q 1/3283; H01Q 1/38
(Continued)

(56) References Cited

U.S. PATENT DOCUMENTS 6,008,698 A * 12/1999 Dacus ................... H03F 1/0211
                                                                330/279
6,600,369 B2 * 7/2003 Mitzlaff ................ H03F 1/0222
                                                                330/10
(Continued)

FOREIGN PATENT DOCUMENTS

JP           7-29108 A      1/1995
JP      2006-287337 A     10/2006
(Continued)

OTHER PUBLICATIONS

Y. Yang et al., "DC Boosting Effect of Active Bias Circuits and Its Optimization for Class-AB InGaP-GaAs HBT Power Amplifiers," *IEEE Transactions on Microwave Theory and Techniques*, vol. 52, No. 5, May 2004, pp. 1455-1463.
(Continued)

*Primary Examiner* — Sonny Trinh
(74) *Attorney, Agent, or Firm* — NSIP Law

(57) ABSTRACT

An envelope tracking (ET) bias circuit includes a detection circuit configured to select an ET operation voltage input through a first input terminal of the detection circuit, or an envelope signal detected from a radio frequency (RF) signal input through a second input terminal of the detection circuit, in response to a first control signal, to and output he selected one of the ET operation voltage and the envelope signal as a detection signal; an amplification circuit configured to amplify the detection signal, and output the amplified detection signal; and a bias output circuit configured to generate an ET bias current based on the amplified signal, and output the generated ET bias current.

20 Claims, 11 Drawing Sheets

(58) Field of Classification Search
USPC .......................................................... 455/41.1
See application file for complete search history.

(56) References Cited

U.S. PATENT DOCUMENTS

| | | | | |
|---|---|---|---|---|
| 6,617,920 | B2* | 9/2003 | Staudinger | H03F 1/0233 330/10 |
| 6,633,750 | B1* | 10/2003 | Dacus | H03F 1/0211 455/115.3 |
| 7,005,923 | B2 | 2/2006 | Noh et al. | |
| 8,106,712 | B2 | 1/2012 | Lee et al. | |
| 9,585,105 | B2* | 2/2017 | Tanaka | H04B 1/0475 |
| 2004/0198271 | A1* | 10/2004 | Kang | H03F 1/086 455/127.1 |
| 2015/0236652 | A1* | 8/2015 | Yang | H03F 1/0205 330/251 |
| 2016/0094192 | A1 | 3/2016 | Khesbak et al. | |
| 2018/0342984 | A1* | 11/2018 | Jo | H03F 1/02 |
| 2019/0058444 | A1* | 2/2019 | Kondo | H03F 1/0222 |

FOREIGN PATENT DOCUMENTS

| | | |
|---|---|---|
| JP | 2013-009200 A | 1/2013 |
| JP | 2015-185863 A | 10/2015 |
| JP | 2016-511617 A | 4/2016 |
| JP | 2017-127001 A | 7/2017 |
| KR | 10-1467231 B1 | 12/2014 |
| KR | 10-2016-0016324 A | 2/2016 |
| KR | 10-2016-0036493 A | 4/2016 |
| WO | 2014/150273 A1 | 9/2014 |
| WO | 2014/160191 A1 | 10/2014 |

OTHER PUBLICATIONS

P. Medrel et al., "A 10-W S-band class-B GaN amplifier with a dynamic gate bias circuit for linearity enhancement," *International Journal of Microwave and Wireless Technologies*, vol. 6, No. 1, Feb. 2014, pp. 3-11, first published online Nov. 29, 2013.

A. Serhan et. al, "Efficiency Enhancement Using Adaptive Bias Control for 60GHz Power Amplifier," *Proceedings of the 2015 IEEE 13th International New Circuits and Systems Conference (NEWCAS 2015)*, pp. 1-4, 2015, conference held Jun. 7-10, 2015, Grenoble, France, paper presented on Jun. 10, 2015.

Korean Office Action dated Feb. 19, 2019 in corresponding Korean Patent Application No. 10-2017-0178413 (5 pages in English, 4 pages in Korean).

Japanese Office Action dated Aug. 13, 2019 in corresponding Japanese Patent Application No. 2018-116339 (3 pages in English, 2 pages in Japanese).

* cited by examiner

ENVELOPE TRACKING BIAS CIRCUIT AND POWER AMPLIFYING DEVICE

CROSS-REFERENCE TO RELATED APPLICATIONS

This application claims the benefit under 35 USC 119(a) of Korean Patent Application Nos. 10-2017-0138695 filed on Oct. 24, 2017, and 10-2017-0178413 filed on Dec. 22, 2017, in the Korean Intellectual Property Office, the entire disclosures of which are incorporated herein by reference for all purposes.

BACKGROUND

1. Field

The following description relates to an envelope tracking bias circuit and a power amplifying device.

2. Description of Related Art

Methods for reducing current consumption of a power amplifier (PA) include an average power tracking (APT) method and an envelope tracking (ET) method.

The APT method is a method for increasing efficiency by adjusting a source voltage VCC according to an average output power of the PA, and the ET method is a method for increasing efficiency by controlling a source voltage of a PA according to an envelope of a radio frequency (RF) signal being amplified by the PA.

The ET method is a method for decreasing average current consumption by decreasing the source voltage of the PA for RF signals having a low amplitude and conversely increasing the source voltage of the PA for RF signals having a high amplitude so as not to deteriorate linearity of the PA.

In addition, the APT method provides a VCC that follows an average value of an envelope signal averaged over a predetermined period of time, whereas the ET method provides a VCC that follows an instantaneous value of the envelope signal. To accomplish this, the ET method uses a separate ET modulator.

A conventional power amplifying device may include an ET bias circuit to reduce current consumption. The conventional ET bias circuit has a structure based on the envelope of the RF signal or a structure providing an ET bias signal based on an ET operation voltage ET_VCC.

However, the conventional ET bias circuit cannot use both the envelope of the RF signal and the ET operation voltage ET_VCC, which limits the range of application of the conventional ET bias circuit to various power amplifying devices having various structures.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an envelope tracking (ET) bias circuit comprises a detection circuit configured to select an ET operation voltage input through a first input terminal of the detection circuit, or an envelope signal detected from a radio frequency (RF) signal input through a second input terminal of the detection circuit, in response to a first control signal, and output the selected one of the ET operation voltage and the envelope signal as a detection signal; an amplification circuit configured to amplify the detection signal, and output the amplified detection signal; and a bias output circuit configured to generate an ET bias current based on the amplified signal, and output the generated ET bias current.

The detection circuit may include an ET VCC detection circuit configured to amplify the ET operation voltage input through the first input terminal, and output the amplified ET operation voltage in response to a VCC control signal of the first control signal; and an RF envelope detection circuit configured to detect an envelope signal from the RF signal input through the second input terminal, and output the envelope signal in response to an RF control signal of the first control signal.

The ET VCC detection circuit may include an inverting amplification circuit configured to inversely amplify the ET operation voltage input through the first input terminal, and switch on and off an output of the inversely amplified ET operation voltage from the ET VCC detection circuit in response to a first VCC control signal of the VCC control signal.

The ET VCC detection circuit may include a first attenuator connected to the first input terminal and configured to attenuate the ET operation voltage input through the first input terminal to be within a predetermined voltage range, and output the attenuated ET operation voltage; a first inverting amplification circuit configured to inversely amplify the attenuated ET operation voltage, and switch on and off an output of the inversely amplified attenuated ET operation voltage from the ET VCC detection circuit in response to a first VCC control signal of the VCC control signal; and a second non-inverting amplification circuit configured to non-inversely amplify the attenuated ET operation voltage, and switch on and off an output of the non-inversely amplified attenuated ET operation voltage from the ET VCC detection circuit in response to a second VCC control signal of the VCC control signal.

The ET VCC detection circuit may include a first inverting amplification circuit configured to inversely amplify the ET operation voltage input through the first input terminal, and switch on and off an output of the inversely amplified ET operation voltage from the ET VCC detection circuit in response to a first VCC control signal of the VCC control signal; and a buffer circuit configured to buffer a reference operation voltage, and switch on and off an output of the buffered reference operation voltage from the ET VCC detection circuit in response to a second VCC control signal of the VCC control signal.

The RF envelope detection circuit may include a rectifying circuit including a negative rectifying circuit configured to detect a negative envelope signal from the RF signal input through the second input terminal, and output the negative envelope signal; and a buffer circuit including a first buffered switch circuit configured to buffer the negative envelope signal, and switch on and off an output of the buffered negative envelope signal from the RF envelope detection circuit in response to a first RF control signal of the RF control signal.

The RF envelope detection circuit may include a rectifying circuit including a negative rectifying circuit configured to detect a negative envelope signal from the RF signal input through the second input terminal, and output the negative envelope signal, and a positive rectifying circuit configured to detect a positive envelope signal from the RF signal input through the second input terminal, and output the positive envelope signal; and a buffer circuit including a first buffered switch circuit configured to buffer the negative envelope signal, and switch on and off an output of the buffered negative envelope signal from the RF envelope detection circuit in response to a first RF control signal of the RF control signal, and a second buffered switch circuit configured to buffer the positive envelope signal, and switch on and off an output of the buffered positive envelope signal from the RF envelope detection circuit in response to a second RF control signal of the RF control signal.

In another general aspect, a power amplifying device includes a power amplifier; a detection circuit configured to select an envelope tracking (ET) operation voltage input through a first input terminal of the detection circuit, or an envelope detected from a radio frequency (RF) signal input through a second input terminal of the detection circuit, in response to a first control signal, and output the selected one of the ET operation voltage and the envelope signal as a detection signal; an amplification circuit configured to amplify the detection signal, and output the amplified detection signal; and a bias output circuit configured to generate an ET bias current based on the amplified detection signal, and output the generated ET bias current to the power amplifier.

The detection circuit may include an ET VCC detection circuit configured to amplify the ET operation voltage input through the first input terminal, and output the amplified ET operation voltage in response to a VCC control signal of the first control signal; and an RF envelope detection circuit configured to detect an envelope signal from the RF signal input through the second input terminal, and output the envelope signal in response to an RF control signal of the first control signal.

The ET VCC detection circuit may include an inverting amplification circuit configured to inversely amplify the ET operation voltage input through the first input terminal, and switch on and off an output of the inversely amplified ET operation voltage from the ET VCC detection circuit in response to a first VCC control signal of the VCC control signal.

The ET VCC detection circuit may include a first attenuator connected to the first input terminal and configured to attenuate the ET operation voltage input through the first input terminal to be within a predetermined voltage range, and output the attenuated ET operation voltage; a first inverting amplification circuit configured to inversely amplify the attenuated ET operation voltage, and switch on and off an output of the inversely amplified attenuated ET operation voltage from the ET VCC detection circuit in response to a first VCC control signal of the VCC control signal; and a second non-inverting amplification circuit configured to non-inversely amplify the attenuated ET operation voltage, and switch on and off an output of the non-inversely attenuated amplified ET operation voltage from the ET VCC detection circuit in response to a second VCC control signal of the VCC control signal.

The ET VCC detection circuit may include a first inverting amplification circuit configured to inversely amplify the ET operation voltage input through the first input terminal, and switch on and off an output of the inversely amplified ET operation voltage from the ET VCC detection circuit in response to a first VCC control signal of the VCC control signal; and a buffer circuit configured to buffer a reference operation voltage, and switch on and off an output of the buffered reference operation voltage from the ET VCC detection circuit in response to a second VCC control signal of the VCC control signal.

The RF envelope detection circuit may include a rectifying circuit including a negative rectifying circuit configured to detect a negative envelope signal from the RF signal input through the second input terminal, and output the negative envelope signal; and a buffer circuit including a first buffered switch circuit configured to buffer the negative envelope signal, and switch on and off an output of the buffered negative envelope signal from the RF envelope detection circuit in response to a first RF control signal of the RF control signal.

The RF envelope detection circuit may include a rectifying circuit including a negative rectifying circuit configured to detect a negative envelope signal from the RF signal input through the second input terminal, and output the negative envelope signal, and a positive rectifying circuit configured to detect a positive envelope signal from the RF signal input through the second input terminal, and output the positive envelope signal; and a buffer circuit including a first buffered switch circuit configured to buffer the negative envelope signal, and switch on and off an output of the buffered negative envelope signal from the RF envelope detection circuit in response to a first RF control signal of the RF control signal, and a second buffered switch circuit configured to buffer the positive envelope signal, and switch on and off an output of the buffered positive envelope signal from the RF envelope detection circuit in response to a second RF control signal of the RF control signal.

In another general aspect, a bias circuit includes a detection circuit configured to receive a radio frequency (RF) signal and an operation voltage, generate a characteristic signal based on a characteristic of the RF signal, and output the operation voltage or the characteristic signal as the detection signal in response to a control signal; and a bias output circuit configured to generate a bias signal based on the detection signal.

The operation voltage may depend on the characteristic of the RF signal.

The detection circuit may be further configured to output the operation voltage as the detection signal in response to the control signal having a first value, and output the characteristic signal as the detection signal in response to the control signal having a second value different from the first value.

The RF signal may be an RF input signal of a power amplifier or an RF output signal of the power amplifier; the operation voltage may be an envelope tracking (ET) operation voltage of the power amplifier that tracks an envelope of the RF input signal or an envelope of the RF output signal; the characteristic signal may be an envelope signal of the RF signal; and the bias output circuit may be further configured to generate an ET bias signal as the bias signal based on the detection signal, and output the ET bias signal to the power amplifier as a bias signal of the power amplifier.

In another general aspect, a bias circuit includes a detection circuit configured to receive a radio frequency (RF) signal and an operation voltage related to the RF signal, generate a time-varying signal based on the RF signal, and output the operation voltage or the time-varying signal as a detection signal in response to a control signal; an amplification circuit configured to amplify the detection signal; and a bias output circuit configured to generate a bias signal based on the amplified detection signal.

The detection circuit may be further configured to output the operation voltage as the detection signal in response to the control signal having a first value, and output the time-varying signal as the detection signal in response to the control signal having a second value different from the first value.

The detection circuit may be further configured to output the detection signal as a differential signal in response to the control signal having a first value corresponding to the amplification circuit having a differential structure, and output the detection signal as a single-ended signal in response to the control signal having a second value corresponding to the amplification circuit having a single-ended structure, the second value being different from the first value.

The RF signal may be an RF input signal of a power amplifier or an RF output signal of the power amplifier; the operation voltage may be an envelope tracking (ET) operation voltage of the power amplifier that tracks an envelope of the RF input signal or an envelope of the RF output signal; the time-varying signal may be an envelope signal of the RF signal; and the bias output circuit may be further configured to generate an ET bias signal as the bias signal based on the detection signal, and output the ET bias signal to the power amplifier as a bias signal of the power amplifier.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
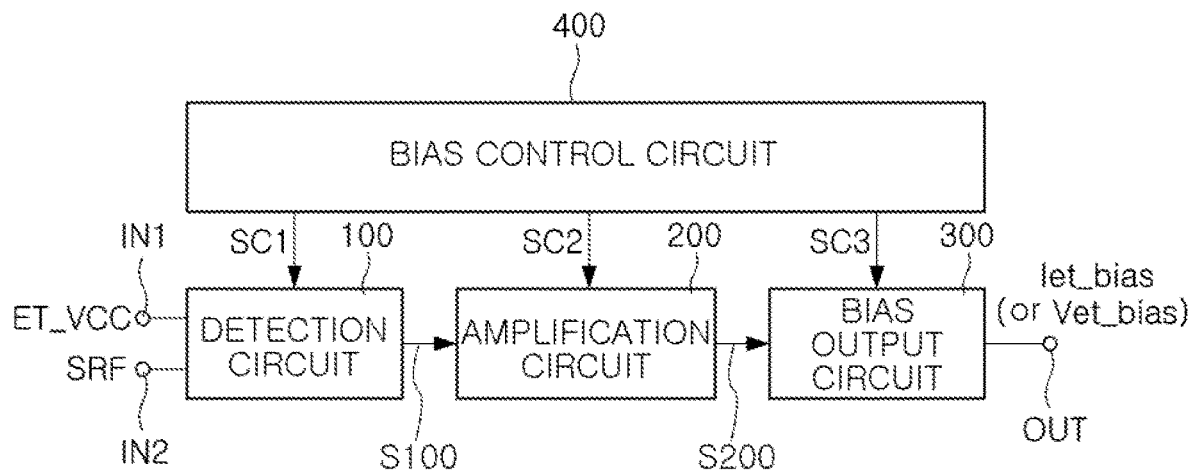
FIG. 1 is a diagram of an example of an envelope tracking bias circuit.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a diagram of an example of an envelope tracking bias circuit.

Referring to FIG. 1, an envelope tracking bias circuit includes a detection circuit 100, an amplification circuit 200, a bias output circuit 300, and a bias control circuit 400 to provide an ET bias signal to a power amplifier (not shown in FIG. 1).

Figure 2:
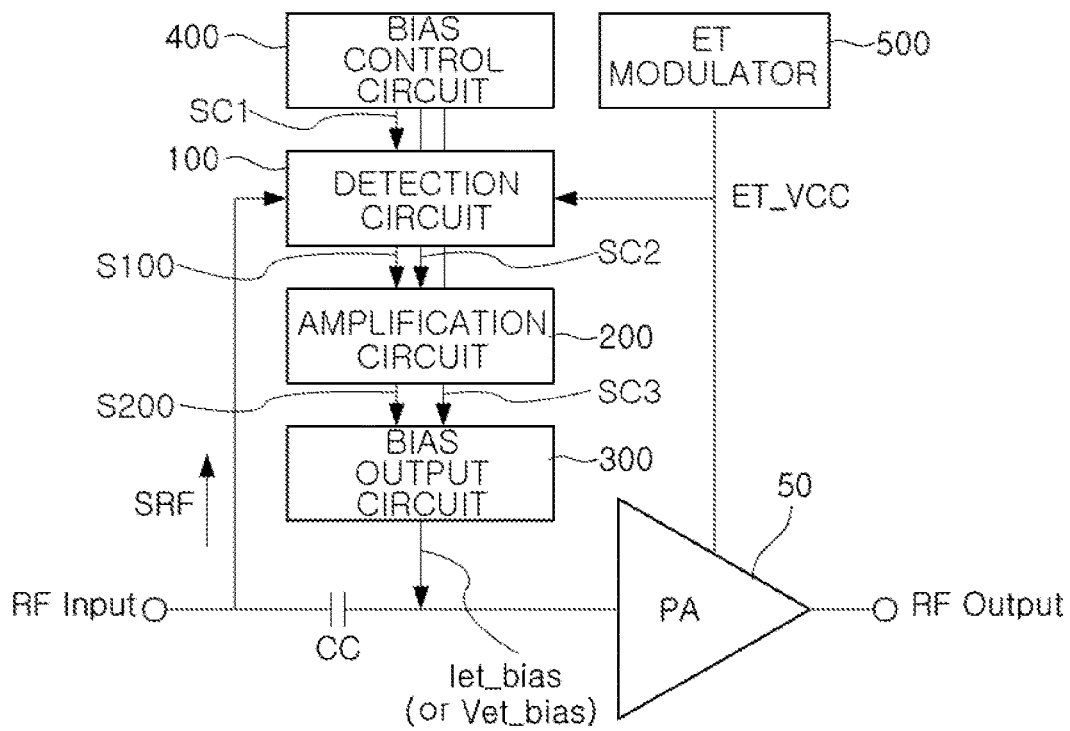
FIG. 2 is a diagram of an example of a power amplifying device.

FIG. 2 is a diagram of an example of a power amplifying device.

Referring to FIG. 2, a power amplifying device includes a power amplifier 50, the detection circuit 100, the amplification circuit 200, the bias output circuit 300, the bias control circuit 400, and an envelope tracking (ET) modulator 500.

The bias control circuit 400 stores characteristic parameters of the power amplifier (PA) 50, and provides a first control signal SC1, or the first control signal SC1 and a second control signal SC2, or the first control signal SC1, the second control signal SC2, and a third control signal SC3, based on the characteristic parameters.

The first control signal SC1 is a control signal for selecting an RF signal mode or an ET_VCC mode, as well as a control signal for selecting a differential signal or a single-ended signal. The second control signal SC2 is a gain control signal. The third control signal SC3 is a control signal for adjusting a level of a bias signal.

In one example, the characteristic parameters are determined according to operation characteristics of the power amplifier PA, and the operation characteristics of the power amplifier include any one or any combination of any two or more of a frequency band, a gain, an output power, a bandwidth, and a power mode of the power amplifier.

The detection circuit 100 selects an ET operation voltage ET_VCC input through a first input terminal IN1, or an envelope signal detected from an RF signal SRF input through a second input terminal IN2, in response to the first control signal SC1, and outputs the selected one of the ET operation voltage ET_VCC and the envelope signal as a detection signal S100. In one example in which the detection circuit 100 simultaneously receives the RF signal SRF and the ET operation voltage ET_VCC, the detection circuit 100 selects and outputs one of the envelope signal and the ET operation voltage ET_VCC. In another example, the detection circuit 100 receives only the RF signal SRF.

The amplification circuit 200 amplifies the detection signal S100 input from the detection circuit 100 to output an amplified signal S200. In one example, the amplification circuit 200 varies an amplification gain in response to the second control signal SC2 from the bias control circuit 400 and differentially amplifies the detection signal S100 according to the varied amplification gain. In one example, the amplification circuit 200 includes a direct current (DC) offset cancellation circuit. In this case, a DC offset of the detection signal S100 is cancelled.

The bias output circuit 300 generates an ET bias current Iet_bias based on the amplified signal S200 input from the amplification circuit 200. In one example, the bias output circuit 300 generates an ET bias current Iet_bias or an ET bias voltage Vet_bias which is adjusted through a current sourcing or a current sinking based on the amplified signal S200 in response to a third control signal SC3 from the bias control circuit 400.

Referring to FIG. 2, the power amplifying device includes the detection circuit 100 that simultaneously receives the RF signal SRF and the ET operation voltage ET_VCC provided from the ET modulator 500. In another example in which the power amplifying device does not include the ET modulator 500, the detection circuit 100 receives only the RF signal SRF.

In the following description, repeated descriptions may be omitted for elements in the drawings having the same reference numeral and the same function, and only differences in the drawings may be described.

Figure 3:
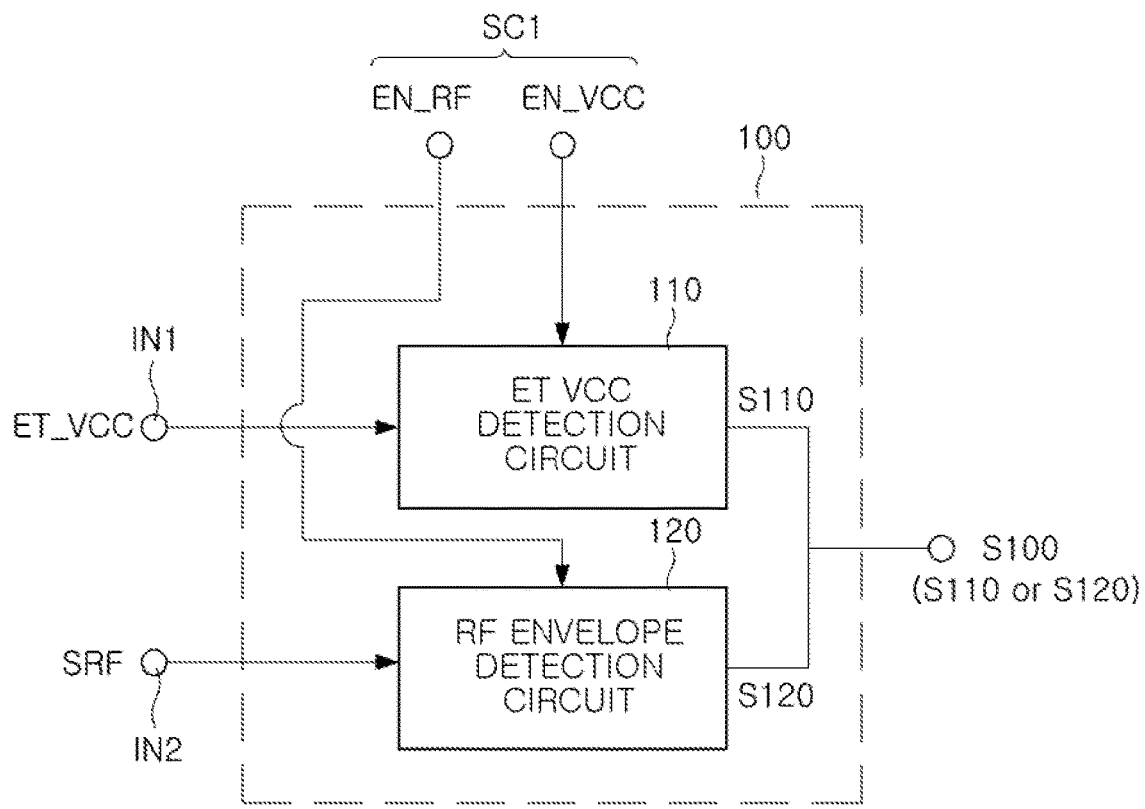
FIG. 3 is a diagram of an example of a detection circuit.

FIG. 3 is a diagram of an example of a detection circuit.

Referring to FIG. 3, the detection circuit 100 includes an ET VCC detection circuit 110 and an RF envelope detection circuit 120.

The ET VCC detection circuit 110 amplifies the ET operation voltage ET_VCC input through the first input terminal IN1 in response to a VCC control signal EN_VCC of the first control signal SC1 to provide the amplified ET operation voltage S110 as the detection signal S100. In an example in which the power amplifying device includes the ET modulator 500 as illustrated in FIG. 2, the ET VCC detection circuit 110 receives the ET operation voltage ET_VCC provided from the ET modulator 500 to the power amplifier (PA) 50.

The RF envelope detection circuit 120 detects an envelope from the RF signal SRF input through the second input terminal IN2 in response to an RF control signal EN_RF of the first control signal SC1 to provide the envelope signal S120 as the detection signal S100. In one example, the RF signal SRF is an RF signal input to the power amplifier 50, and in another example, the RF signal SRF is an RF signal output from the power amplifier 50.

Referring to FIG. 3, the bias control circuit 400 provides the VCC control signal EN_VCC and the RF control signal EN_RF included in the first control signal SC1. In one example, the bias control circuit 400 provides the RF control signal EN_RF having an active level in the case of an RF signal mode, and provides the VCC control signal EN_VCC having an active level in the case of an ET_VCC mode.

Figure 4:
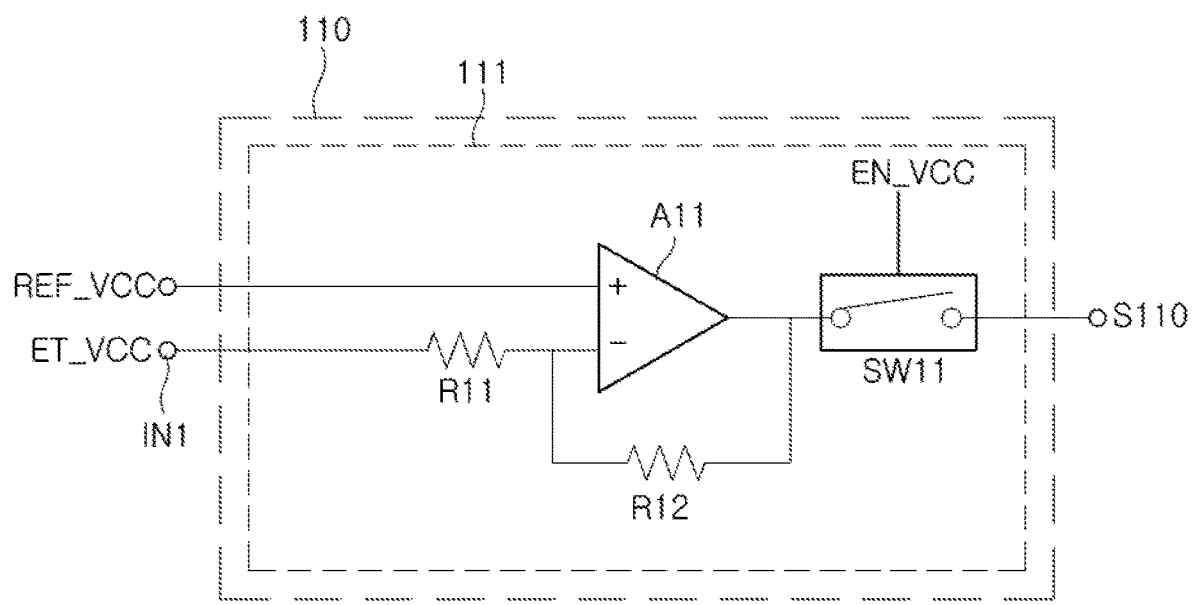
FIG. 4 is a diagram of an example of the ET VCC detection circuit of FIG. 3.

FIG. 4 is a diagram of an example of the ET VCC detection circuit of FIG. 3.

Referring to FIG. 4, the ET VCC detection circuit 110 includes an inverting amplification circuit 111.

The inverting amplification circuit 111 inversely amplifies the ET operation voltage ET_VCC input through the first input terminal IN1, and switches on and off an output of the inversely amplified ET operation voltage S110 in response to the VCC control signal EN_VCC.

In the example illustrated in FIG. 4, the inverting amplification circuit 111 includes a first operational amplifier A11, a first switch SW11, and resistors R11 and R12. The resistor R11 is connected to an inverting input terminal of the first operational amplifier A11, and the resistor R12 is connected between the inverting input terminal of the first operational amplifier A11 and an output terminal of the first operational amplifier A11. The resistors R11 and R12 determine an inverting amplification gain (R12/R11) of the first operational amplifier A11.

The first operational amplifier A11 receives a reference voltage REF_VCC through a non-inverting input terminal and inversely amplifies the ET operation voltage ET_VCC input to the inverting input terminal with the inverting amplification gain to output the inversely amplified ET operation voltage S110 through an output terminal of the first operational amplifier A11. In actuality, the first operational amplifier A11 outputs an inversely amplified difference between the ET operation voltage ET_VCC and the reference voltage REF_VCC. However, for simplicity of description, the output of the first operational amplifier A11 will be referred to the inversely amplified ET operation voltage S110.

The first switch SW11 is connected to the output terminal of the first operational amplifier A11 and is in an ON state (e.g., the ET_VCC mode) or an OFF state (e.g., the RF signal mode) in response to the VCC control signal EN_VCC. When the first switch SW11 is in the ON state, the inversely amplified ET operation voltage S110 is output, and when the first switch SW11 is in the OFF state, the inversely amplified ET operation voltage S110 is not output.

Figure 5:
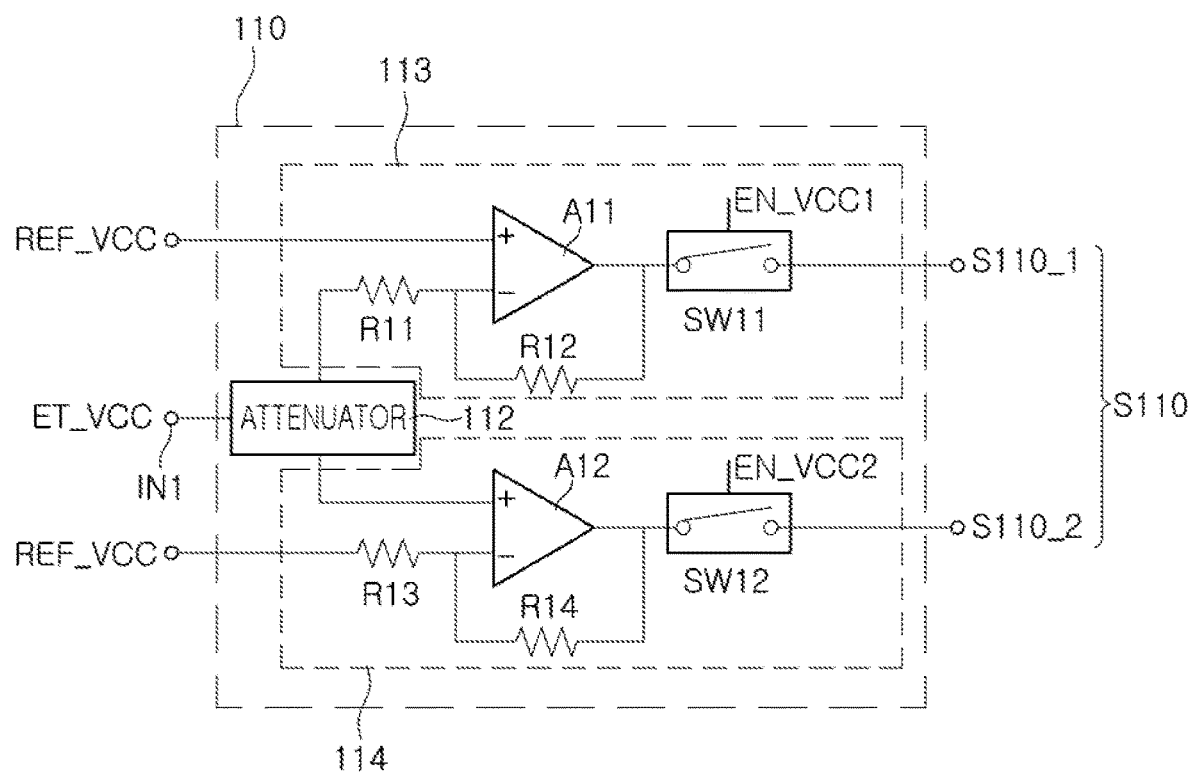
FIG. 5 is a diagram of another example of the ET VCC detection circuit of FIG. 3.

FIG. 5 is a diagram of another example of the ET VCC detection circuit of FIG. 3.

Referring to FIG. 5, the ET VCC detection circuit 110 includes a first attenuator 112, a first inverting amplification circuit 113, and a second non-inverting amplification circuit 114.

The first attenuator 112 is connected to the first input terminal IN1 to attenuate the ET operation voltage ET_VCC input through the first input terminal IN1 to be within a predetermined voltage range. In one example, the ET VCC detection circuit 110 receives the ET operation voltage ET_VCC having a relatively high voltage range, and the ET operation voltage ET_VCC needs to be attenuated by the first attenuator 112 to a lower voltage range that can be processed by a following stage of the ET VCC detection circuit 110 without distortion.

The first inverting amplification circuit 113 inversely amplifies the ET operation voltage ET_VCC input through the first attenuator 112, and switches on and off an output of the inversely amplified ET operation voltage S110_1 in response to a first VCC control signal EN_VCC1 of the VCC control signal EN_VCC.

In one example, the first inverting amplification circuit 113 includes a first operational amplifier A11, a first switch SW11, and resistors R11 and R12. The first inverting amplification circuit 113 performs the same operations as the inverting amplification circuit 111 illustrated in FIG. 4, and outputs or does not output the inversely amplified ET operation voltage S110_1 in response to the first VCC control signal EN_VCC1. In actuality, the first operational amplifier A11 outputs an inversely amplified difference between the ET operation voltage ET_VCC input through the first attenuator 112 and a reference voltage REF_VCC input through a non-inverting input terminal of the first operational amplifier A11. However, for simplicity of description, the output of the first operational amplifier A11 will be referred to the inversely amplified ET operation voltage S110_1.

The second inverting amplification circuit 114 non-inversely amplifies the ET operation voltage ET_VCC input through the first attenuator 112, and switches on and off an output of the non-inversely amplified ET operation voltage S110_2 in response to a second VCC control signal EN_VCC2 of the VCC control signal EN_VCC.

In one example, the non-inverting amplification circuit 114 includes a second operational amplifier A12, a second switch SW12, and resistors R13 and R14. The resistor R13 is connected to an inverting input terminal of the second operational amplifier A12, the resistor R14 is connected between the inverting input terminal of the operational amplifier A12 and an output terminal of the operational amplifier A12. The resistors R13 and R14 determine a non-inverting amplification gain (1+R14/R13) of the second operational amplifier A12.

The second operational amplifier A12 receives a reference voltage REF_VCC through an inverting input terminal and non-inversely amplifies the ET operation voltage ET_VCC input to the non-inverting input terminal through the first attenuator 112 with the non-inverting amplification gain to output the non-inversely amplified ET operation voltage S110_2 through an output terminal of the second operational amplifier A12. In actuality, the second operational amplifier A12 outputs a non-inversely amplified difference between the ET operation voltage ET_VCC input through the first attenuator 112 and the reference voltage REF_VCC. However, for simplicity of description, the output of the second operational amplifier A12 will be referred to the non-inversely amplified ET operation voltage S110_2.

The second switch SW12 is connected to the output terminal of the second operational amplifier A12 and is in an ON state or an OFF state depending on a value of the second VCC control signal EN_VCC2. When the second switch SW12 is in the ON state, the non-inversely amplified ET operation voltage S110_2 is output, and when the second switch SW12 is in the OFF state, the non-inversely amplified ET operation voltage S110_2 is not output.

In one example, the inversely amplified ET operation voltage S110_1 and the non-inversely amplified ET operation voltage S110_2 are differential voltage signals having phases opposite to each other. For example, in a case in which the amplification circuit 200 has a differential amplification structure, both the inversely amplified ET operation voltage S110_1 and the non-inversely amplified ET operation voltage S110_2 are output by the VCC control signal EN_VCC of the first control signal SC1, and in a case in which the amplification circuit 200 has a single-ended amplification structure, only one of the inversely amplified ET operation voltage S110_1 and the non-inversely amplified ET operation voltage S110_2 is output by the VCC control signal EN_VCC of the first control signal SC1.

Referring to FIG. 5, the bias control circuit 400 outputs a first VCC control signal EN_VCC1 and a second VCC control signal EN_VCC2 that are included in the VCC control signal EN_VCC. In one example, in the case of a single-ended mode, the bias control circuit 400 outputs only one of the first VCC control signal EN_VCC1 and the second VCC control signal EN_VCC2 as a signal having an active level, and in the case of a differential mode, the bias control circuit 400 outputs both the first VCC control signal EN_VCC1 and the second VCC control signal EN_VCC2 as signals having an active level. In the case of the single-ended mode, the one of the first VCC control signal EN_VCC1 and the second VCC control signal EN_VCC2 that is output as a signal having an active level may be set in advance.

Figure 6:
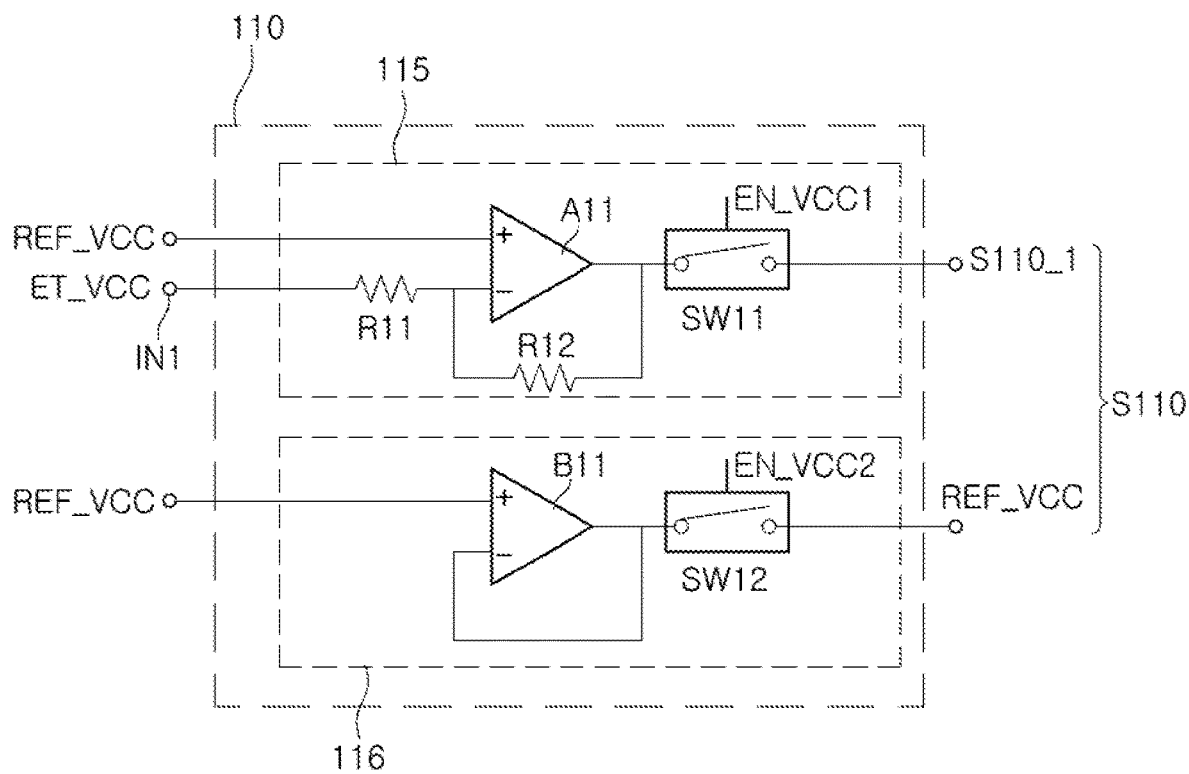
FIG. 6 is a diagram of another example of the ET VCC detection circuit of FIG. 3.

FIG. 6 is a diagram of another example of the ET VCC detection circuit of FIG. 3.

Referring to FIG. 6, the ET VCC detection circuit 110 includes a first inverting amplification circuit 115 and a buffer circuit 116.

The first inverting amplification circuit 115 inversely amplifies the ET operation voltage ET_VCC input through the first input terminal IN1, and switches on and off an output of the inversely amplified ET operation voltage S110_1 in response to a first VCC control signal EN_VCC1 of the VCC control signal EN_VCC.

The buffer circuit 116 buffers a reference operation voltage REF_VCC and switches on and off an output of the buffered reference operation voltage REF_VCC in response to a second VCC control signal EN_VCC2 of the VCC control signal EN_VCC.

In one example, the first inverting amplification circuit 115 includes a first operational amplifier A11, a first switch SW11, and resistors R11 and R12. The first inverting amplification circuit 115 performs the same operations as the inverting amplification circuit 111 illustrated in FIG. 4, and outputs or does not output the inversely amplified ET operation voltage S110_1 in response to the first VCC control signal EN_VCC1. In actuality, the first operational amplifier A11 outputs an inversely amplified difference between the ET operation voltage ET_VCC input through the first attenuator 112 and the reference voltage REF_VCC input through a non-inverting input terminal of the first operational amplifier A11. However, for simplicity of description, the output of the first operational amplifier A11 will be referred to the inversely amplified ET operation voltage S110_1.

The buffer circuit 116 outputs or does not output a buffered reference operation voltage REF_VCC in response to the second VCC control signal EN_VCC2. In one example, the buffer circuit 116 includes a buffer amplifier B11 and a switch SW12. The buffer amplifier B11 outputs the input reference operation voltage REF_VCC from an output terminal of the buffer amplifier B11 as a buffered reference operation voltage REF_VCC, and the switch SW12 switches on and off the buffered reference operation voltage REF_VCC in response to the second VCC control signal EN_VCC2.

For example, in a case in which the amplification circuit 200 has a differential amplification structure, both the inversely amplified ET operation voltage S110_1 and the buffered reference operation voltage REF_VCC are output in response to the first VCC control signal EN_VCC1 and the second VCC control signal EN_VCC2, respectively, and in a case in which the amplification circuit 200 has a single-ended amplification structure, the buffered reference operation voltage REF_VCC is not output in response to the second VCC control signal EN_VCC2, and only the inversely amplified ET operation voltage S110_1 is output in response to the first VCC control signal EN_VCC1.

Referring to FIG. 6, the bias control circuit 400 outputs a first VCC control signal EN_VCC1 and a second VCC control signal EN_VCC2 as the VCC control signal EN_VCC. For example, in the case of a single-ended mode, the bias control circuit 400 outputs only the first VCC control signal EN_VCC1 as a signal having an active level, and in the case of a differential mode, the bias control circuit 400 outputs both the first VCC control signal EN_VCC1 and the second VCC control signal EN_VCC2 as signals having an active level.

Figure 7:
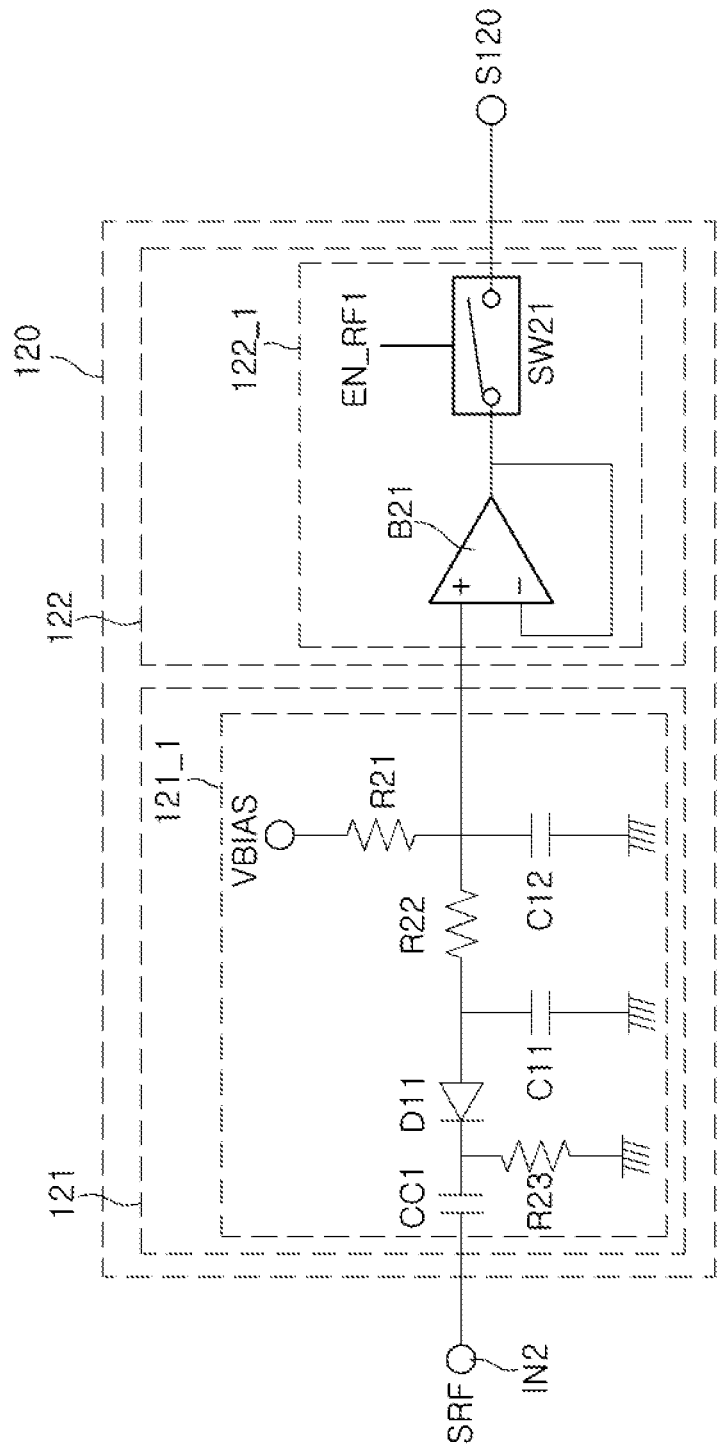
FIG. 7 is a diagram of an example of the RF envelope detection circuit of FIG. 3.

FIG. 7 is a diagram of an example of the RF envelope detection circuit of FIG. 3.

Referring to FIG. 7, the RF envelope detection circuit 120 includes a rectifying circuit 121 including a negative rectifying circuit 121_1, and a buffer circuit 122 including a first buffered switch circuit 122_1.

The negative rectifying circuit 121_1 detects a negative envelope from the RF signal SRF input through the second input terminal IN2. In one example, the negative rectifying circuit 121_1 includes a DC blocking capacitor CC1 connected to the second input terminal IN2, a first diode D11 having a cathode connected to the DC blocking capacitor CC1 and performing a negative rectification, a resistor R22 connected between an anode of the first diode D11 and an input terminal of the buffer circuit 122, a resistor R21 connected between a connection node between the resistor R22 and the input terminal of the buffer circuit 122 and a bias voltage VBIAS terminal, a capacitor C12 connected between the connection node between the resistor R22 and the input terminal of the buffer circuit 122 and a ground, a capacitor C11 connected between the anode of the first diode D11 and the ground, and a resistor R23 connected between the cathode of the first diode D11 and the ground. The resistor R22 and the capacitor C12 form a low-pass RC filter that filters the detected negative envelope signal.

The first buffered switch circuit 122_1 buffers and switches on and off a signal output from the negative rectifying circuit 121_1. In one example, the first buffered switch circuit 122_1 includes a first non-inverting buffer B21 and a first buffer switch SW21 connected in series between the negative rectifying circuit 121_1 and an output terminal of the buffer circuit 122. The first non-inverting buffer B21 buffers the negative envelope signal input from the negative rectifying circuit 121_1 and outputs the buffered negative envelope signal from an output terminal of the first non-inverting buffer B21, and the first buffer switch SW21 switches on and off the buffered negative envelope signal S120 output from the first non-inverting buffer B21 in response to the first RF control signal EN_RF1 of the RF control signal EN_RF.

Referring to FIG. 7, the bias control circuit 400 in FIGS. 1 and 2 outputs the first RF control signal EN_RF1 of the RF control signal EN_RF. In one example, in the case of an RF signal mode, the bias control circuit 400 outputs the first RF control signal EN_RF1 as a signal having an active level.

Figure 8:
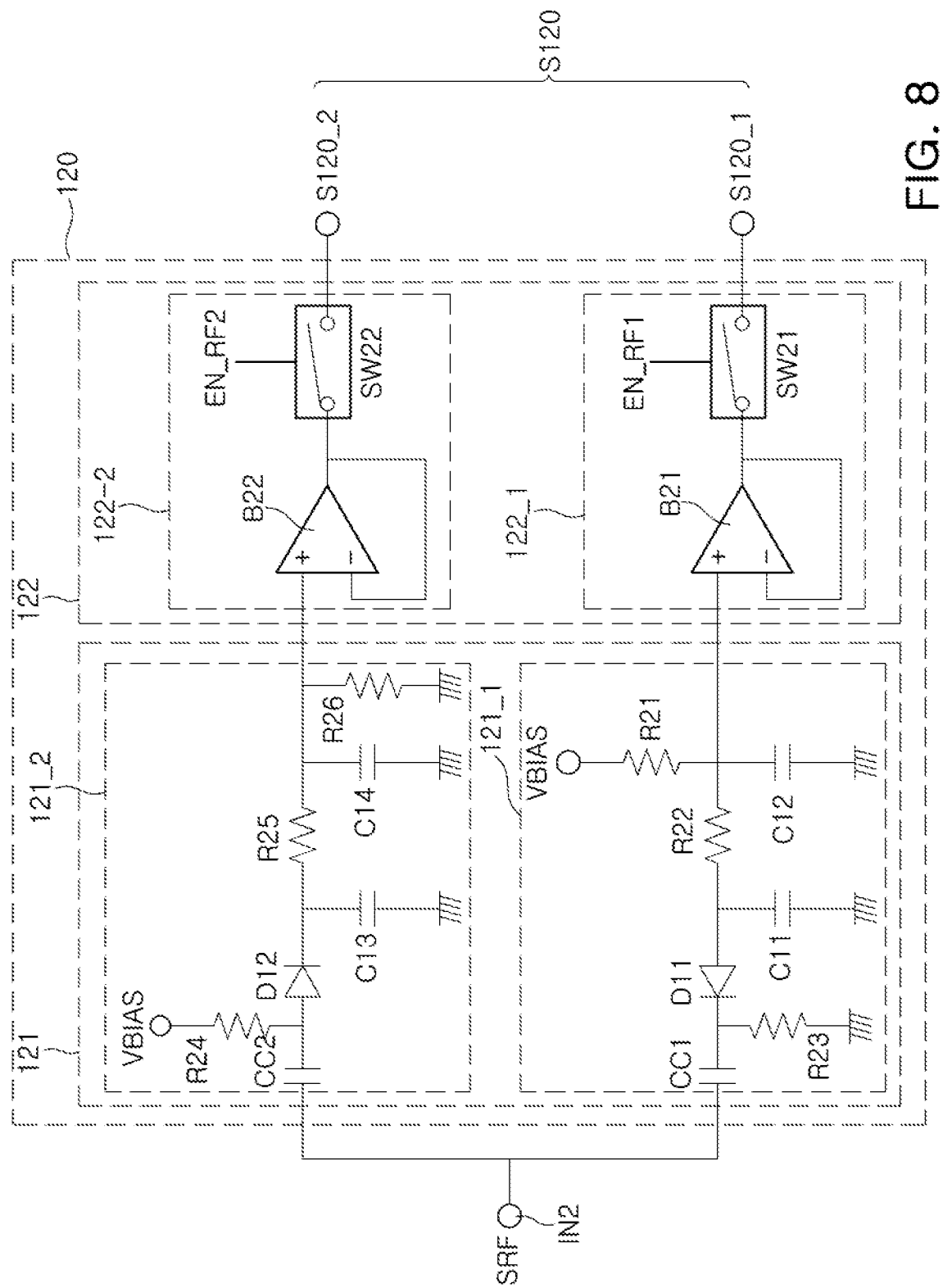
FIG. 8 is a diagram of another example of the RF envelope detection circuit of FIG. 3.

FIG. 8 is a diagram of an another example of the RF envelope detection circuit of FIG. 3.

Referring to FIG. 8, the RF envelope detection circuit 120 includes a rectifying circuit 121 including a negative rectifying circuit 121_1 and a positive rectifying circuit 121_2, and a buffer circuit 122 including a first buffered switch circuit 122_1 and a second buffered switch circuit 122_2.

The negative rectifying circuit 121_1 detects a negative envelope from the RF signal SR input through the second input terminal IN2 to output a negative envelope signal S120_1, and the positive rectifying circuit 121_2 detects a positive envelope from the RF signal SRF input through the second input terminal IN2 to output a positive envelope signal S120_2.

The first buffered switch circuit 122_1 buffers and switches on and off the negative envelope signal S120_1 output from the negative rectifying circuit 121_1, and the second buffered switch circuit 122_2 buffers and switches on and off the positive envelope signal S120_2 output from the positive rectifying circuit 121_2.

In one example, the negative rectifying circuit 121_1 and the first buffered switch circuit 122_1 operate in the same way as the negative rectifying circuit 121_1 and the first buffered switch circuit 122_1 of FIG. 7 to output the negative envelope signal 120_1.

In one example, the positive rectifying circuit 121_2 includes a DC blocking capacitor CC2 connected to the second input terminal IN2, a second diode D12 having an anode connected to the DC blocking capacitor CC2 and performing a positive rectification, a resistor R25 connected between a cathode of the second diode D12 and an input terminal of the buffer circuit 122, a resistor R24 connected between the anode of the second diode D12 and a bias voltage VBIAS terminal, a capacitor C13 connected between the cathode of the second diode D12 and a ground, and a capacitor C14 and a resistor R26 connected between a connection node between the resistor R25 and the input terminal of the buffer circuit 122 and the ground.

In one example, the second buffered switch circuit 122_2 includes a second non-inverting buffer B22 and a second buffer switch SW22 connected in series between the positive rectifying circuit 121_2 and an output terminal of the buffer circuit 122. The second non-inverting buffer B22 buffers the positive envelope signal input from the positive rectifying circuit 121_2 and outputs the buffered positive envelope signal from an output terminal of the second non-inverting buffer B22. The second buffer switch SW22 switches on and off the buffered positive envelope signal S120_2 output from the second non-inverting buffer B22 in response to the second RF control signal EN_RF2 of the RF control signal EN_RF.

Referring to FIG. 8, the bias control circuit 400 in FIGS. 1 and 2 outputs the first RF control signal EN_RF1 and the second RF control signal EN_RF2 of the RF control signal EN_RF. In one example, in the case of a single-ended mode, the bias control circuit 400 outputs only one of the first RF control signal EN_RF1 and the second RF control signal EN_RF2 as a signal having an active level, and in the case of a differential mode, the bias control circuit 400 outputs both the first RF control signal EN_RF1 and the second RF control signal EN_RF2 as signals having an active level. In the case of the single-ended mode, the one of the first RF control signal EN_RF1 and the second RF control signal EN_RF2 that is output as a signal having an active level may be set in advance.

The first diode D11 performing the negative rectification and the second diode D12 performing the positive rectification are rectifying elements connected in opposite directions, and respectively detect the negative envelope and the positive envelope of the RF signal SRF. The resistor R22 and the capacitor C12 form a first low-pass RC filter that filters the detected negative envelope signal, and the resistor R25 and the capacitor C14 form a second low-pass RC filter that filters the detected positive envelope signal.

Figure 9:
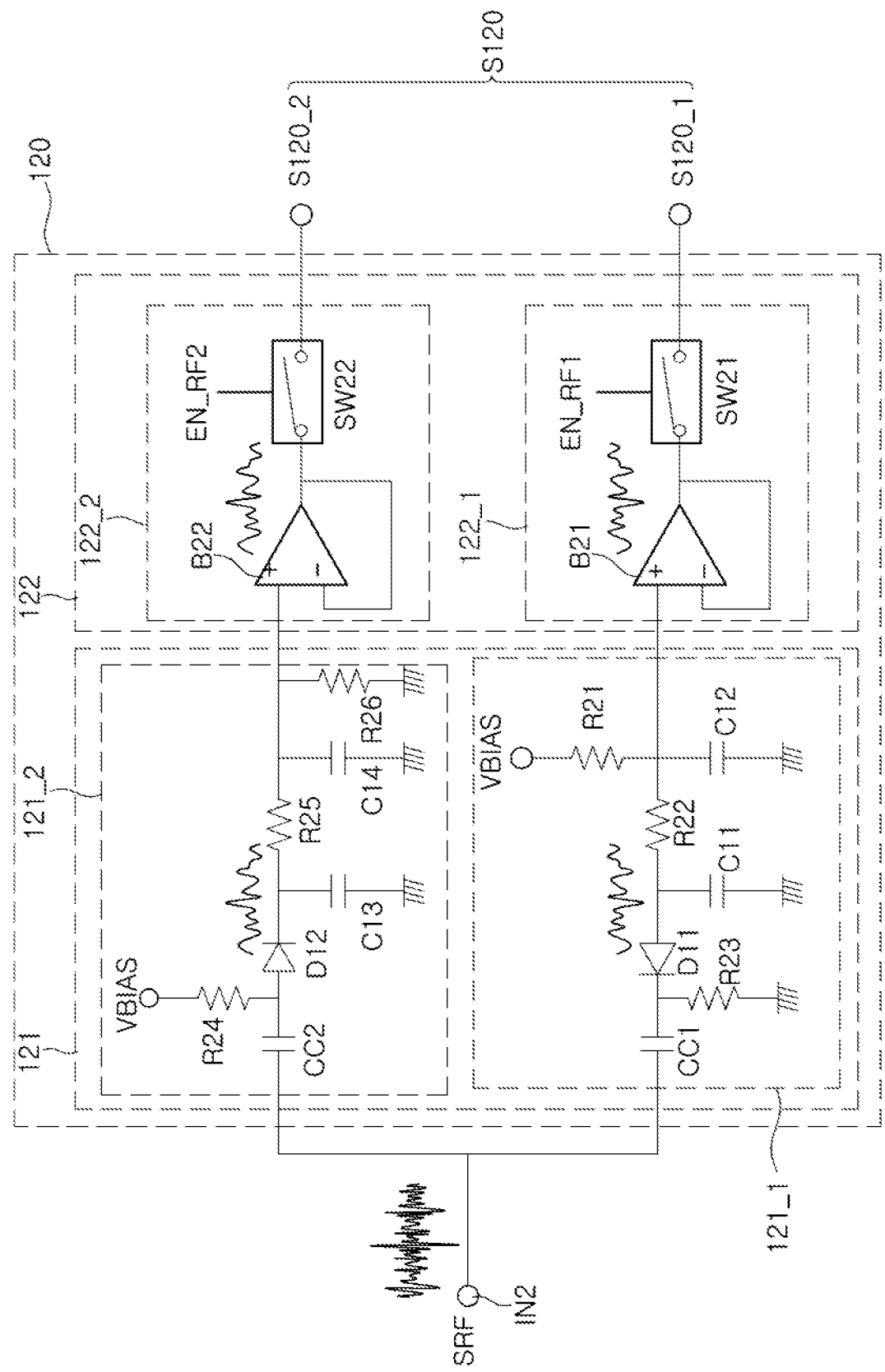
FIG. 9 is a diagram of an example of waveforms of the RF envelope detection circuit of FIG. 8.

FIG. 9 is a diagram of an example of waveforms of the RF envelope detection circuit of FIG. 8.

FIG. 9 illustrates examples of signal waveforms at main nodes of the RF envelope detection circuit 120 of FIG. 8.

The negative envelope signal of the input RF signal SRF is detected by the negative rectifying circuit 121_1 and buffered by the first buffered switch circuit 122_1.

The positive envelope signal of the input RF signal SRF is detected by the positive rectifying circuit 121_2 and buffered by the second buffered switch circuit 122_2.

Figure 10:
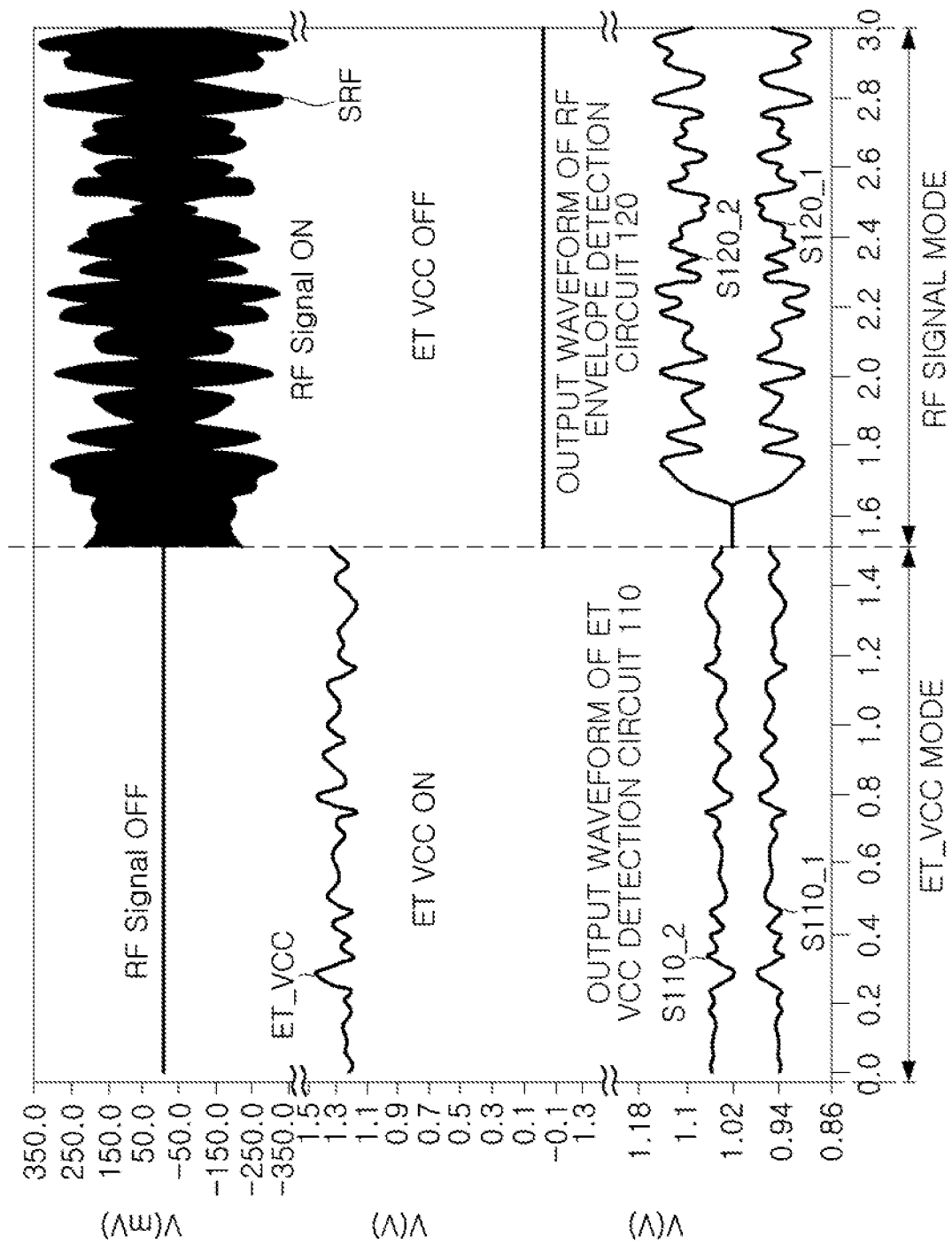
FIG. 10 is a diagram of an example of waveforms of input and output signals of the ET VCC detection circuit and the RF envelope detection circuit of FIG. 3.

FIG. 10 is a diagram of an example of waveforms of input and output signals of the ET VCC detection circuit and the RF envelope detection circuit of FIG. 3.

FIG. 10 illustrates examples of waveforms of input and output signals of the ET VCC detection circuit 110 and the RF envelope detection circuit 120 of FIG. 3 in a case in which the envelope tracking bias circuit or the power amplifying device operates in an ET VCC mode, and a case in which the envelope tracking bias circuit or the power amplifying device operates in an RF signal mode. The waveforms in FIG. 10 were obtained by performing a test in which the RF signal SRF was turned off and only the ET operation voltage ET_VCC was applied from 0 μs to 1.5 μs, and the ET operation voltage ET_VCC was turned off and only the RF signal SRF was applied from 1.5 μs to 3 μs.

Referring to FIG. 10, in a case in which the envelope tracking bias circuit or the power amplifying device operates in the ET VCC mode, the ET VCC detection circuit 110 is enabled (i.e., is in an active state) and the RF envelope detection circuit 120 disabled (i.e., is in a non-active state). In this case, the inversely amplified ET operation voltage S110_1 and the non-inversely amplified ET operation voltage S110_2 are output.

In contrast, in a case in which the envelope tracking bias circuit or the power amplifying device operates in the RF signal mode, the ET VCC detection circuit 110 is disabled (i.e., is in a non-active state) and the RF envelope detection circuit 120 is enabled (i.e., is in an active state). In this case, the negative envelope signal S120_1 and the positive envelope signal S120_2 are output.

As can be seen from FIG. 10, only the ET operation voltage ET_VCC is applied from 0 μs to 1.5 μs, and the inversely amplified ET operation voltage S110_1 and the non-inversely amplified ET operation voltage S110_2 are output in a state in which only the ET VCC detection circuit 110 is an ON state.

Thereafter, as can be seen from FIG. 10, only the RF signal SRF is applied from 1.5 μs to 3 μs, and the negative envelope signal S120_1 and the positive envelope signal S120_2 are output in a state in which only the RF envelope detection circuit 120 is in an ON state.

FIG. 10 illustrates an example in which the amplification circuit 200 has the differential structure, but the structure of the amplification circuit 200 is not limited thereto, and may instead have a singled-ended structure.

Figure 11:
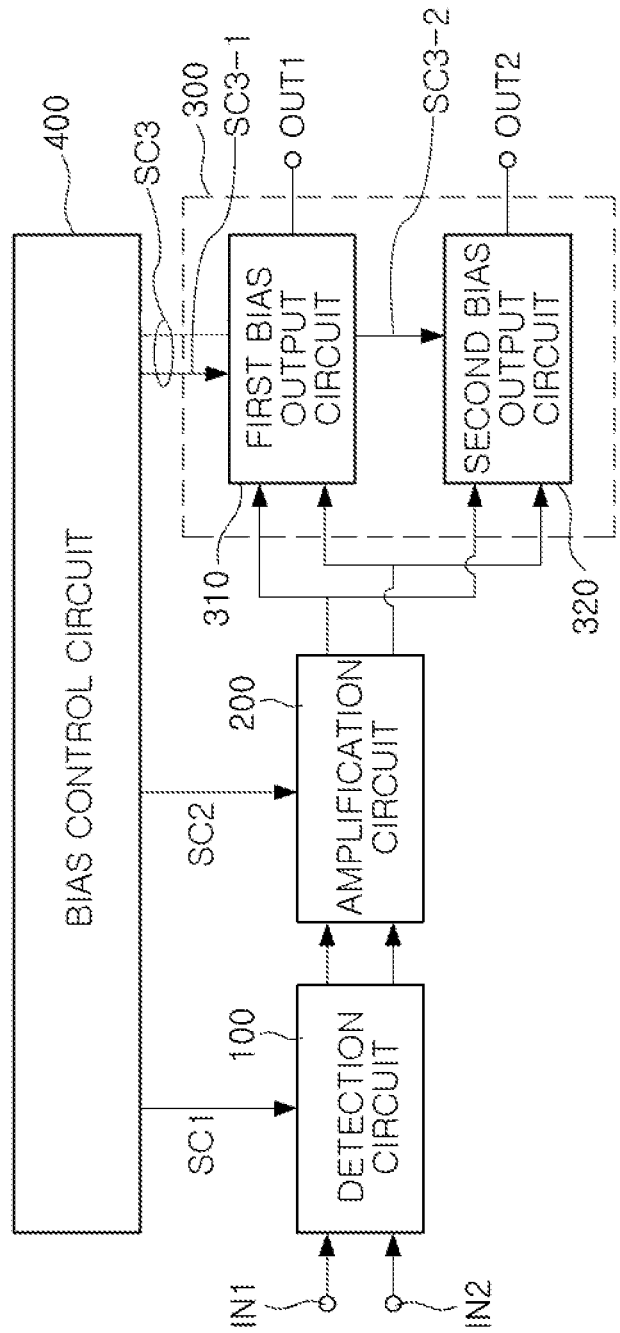
FIG. 11 is a diagram of another example of an envelope tracking bias circuit.
Figure 12:
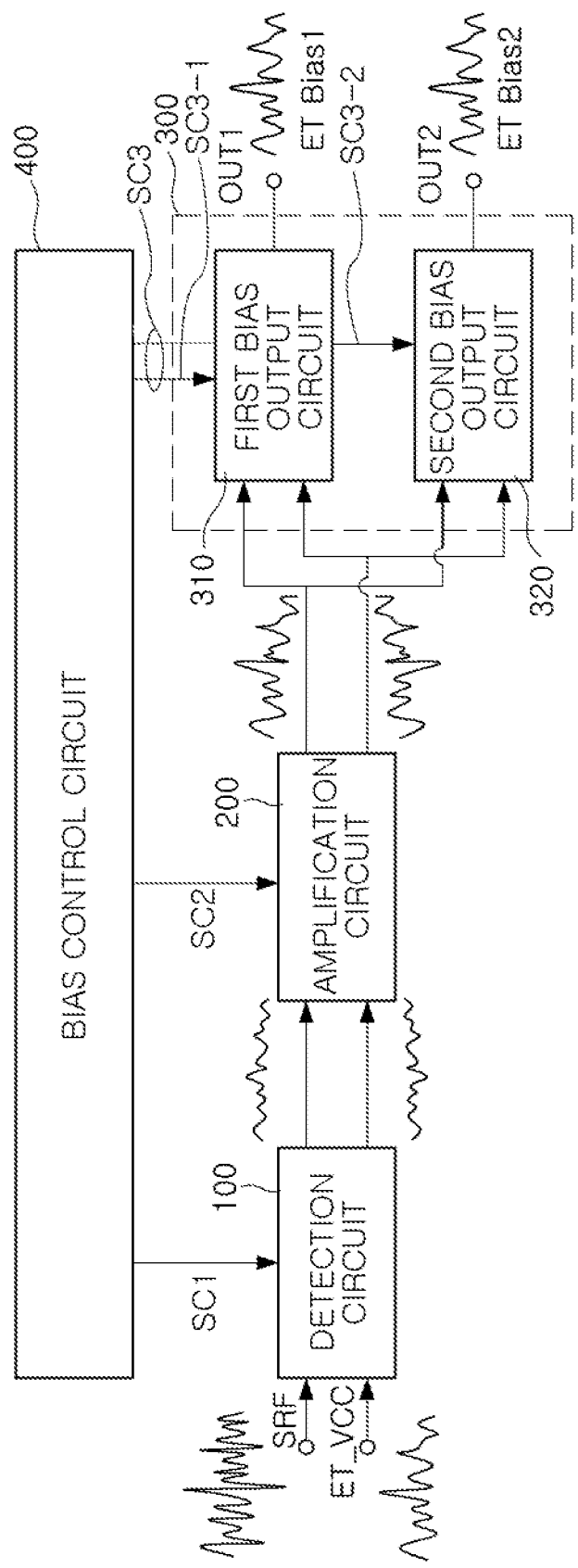
FIG. 12 is a diagram of an example of waveforms of the envelope tracking bias circuit of FIG. 11.

FIG. 11 is a diagram illustrating another example of an envelope tracking bias circuit, and FIG. 12 is a schematic diagram of an example of waveforms of the envelope tracking bias circuit of FIG. 11.

Referring to FIGS. 11 and 12, a bias output circuit 300 includes a first bias output circuit 310 and a second bias output circuit 320.

The first bias output circuit 310 provides a first bias signal to a first power amplifier, such as a drive amplifier DA (not shown in FIG. 11), of a power amplification circuit via a first output terminal OUT1, and the second bias output circuit 320 provides a second bias signal to a second power amplifier, such as a power amplifier PA (not shown in FIG. 11), of the power amplification circuit via a second output terminal OUT2. In one example, the drive amplifier DA and the power amplifier PA are connected in series to obtain a larger overall amplification gain. The drive amplifier DA receives an input signal from an input terminal (not shown in FIG. 11), and an output of the drive amplifier DA is connected to an input of the power amplifier PA. The drive amplifier DA provides part of the overall amplification gain, performs impedance matching between the input terminal and the power amplifier PA, and acts as a buffer between the input terminal and the power amplifier PA.

In one example, as illustrated in FIG. 11, the first bias output circuit 310 is controlled by a first third control signal SC3_1 of a third control signal SC3 output from a bias control circuit 400, and the second bias output circuit 320 is controlled separately from the first bias output circuit 310 by a second third control signal SC3_2 of the third control signal SC3 output from the bias control circuit 400.

Figure 13:
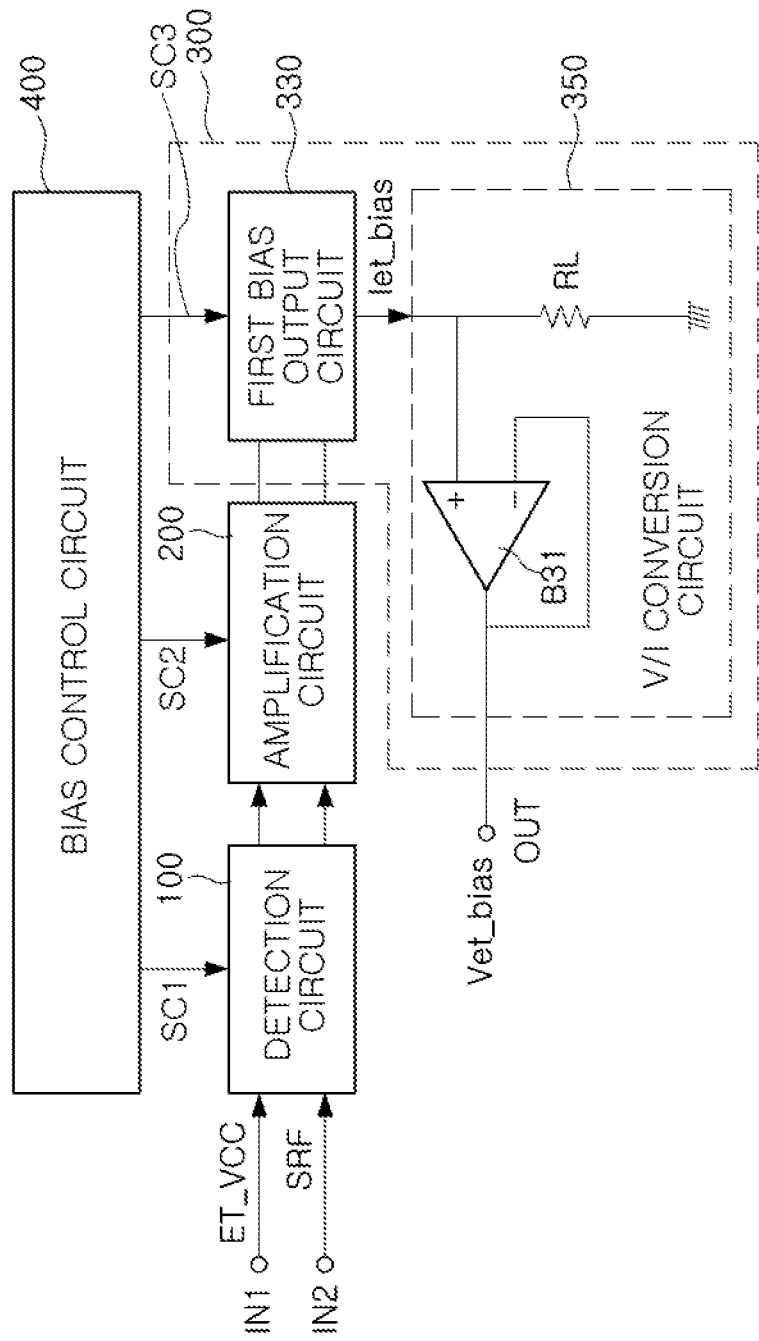
FIG. 13 is a diagram of another example of an envelope tracking bias circuit.

FIG. 13 is a diagram illustrating another example of an envelope tracking bias circuit.

Referring to FIG. 13, a bias output circuit 300 includes a first bias output circuit 330 and a V/I conversion circuit 350.

In one example, the V/I conversion circuit 350 includes a load resistor RL and a buffer B31. In a case in which the first bias output circuit 330 outputs an ET bias current Iet_bias, the V/I conversion circuit 350 converts the ET bias current Iet_bias into an ET bias voltage Vet_bias and outputs the converted ET bias voltage Vet_bias.

Accordingly, the envelope tracking bias circuit of FIG. 13 expands an application range of the power amplifying device to which the envelope tracking bias circuit is applied.

Figure 14:
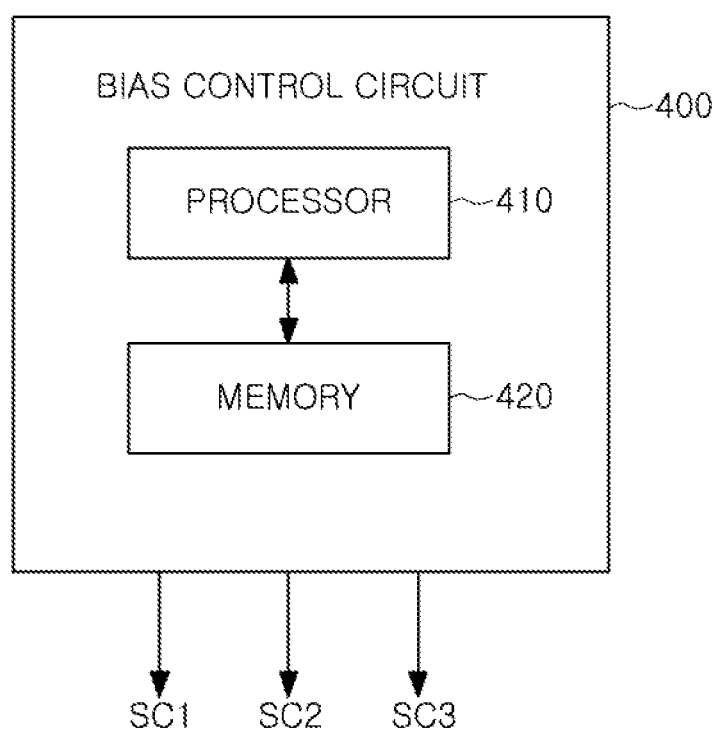
FIG. 14 is a diagram of an example of a bias control circuit of an envelope tracking bias circuit.

FIG. 14 is a diagram of an example of a bias control circuit of an envelope tracking bias circuit.

Referring to FIG. 14, a bias control circuit 400 includes a processor 410 and a memory 420. The memory 420 stores instructions that, when executed by the processor 410, cause the processor 410 to perform the functions of the bias control circuit 400 in FIGS. 1, 2, and 11 to 13 as described with reference to FIGS. 1 to 13.

According to the examples described above, since the bias signal of the power amplifier (PA) is provided by selectively using one of the envelope signal detected from the RF signal and the ET VCC operation voltage, an ET bias suitable for PA characteristics is provided.

As described above, since the envelope tracking bias circuit uses both the envelope signal detected from the RF signal and the ET VCC operation voltage, it has a broad applicability, and since the envelope tracking bias circuit is designed to provide the ET bias signal as either a current or a voltage, the application range of the envelope tracking bias circuit to a power amplifier (PA) integrated circuit is expanded.

The bias control circuit 400 in FIGS. 1, 2, and 11 to 14 and the processor 410 and the memory 420 in FIG. 14 that perform the operations described in this application are implemented by hardware components configured to perform the operations described in this application that are performed by the hardware components. Examples of hardware components that may be used to perform the operations described in this application where appropriate include controllers, sensors, generators, drivers, memories, comparators, arithmetic logic units, adders, subtractors, multipliers, dividers, integrators, and any other electronic components configured to perform the operations described in this application. In other examples, one or more of the hardware components that perform the operations described in this application are implemented by computing hardware, for example, by one or more processors or computers. A processor or computer may be implemented by one or more processing elements, such as an array of logic gates, a controller and an arithmetic logic unit, a digital signal processor, a microcomputer, a programmable logic controller, a field-programmable gate array, a programmable logic array, a microprocessor, or any other device or combination of devices that is configured to respond to and execute instructions in a defined manner to achieve a desired result. In one example, a processor or computer includes, or is connected to, one or more memories storing instructions or software that are executed by the processor or computer. Hardware components implemented by a processor or computer may execute instructions or software, such as an operating system (OS) and one or more software applications that run on the OS, to perform the operations described in this application. The hardware components may also access, manipulate, process, create, and store data in response to execution of the instructions or software. For simplicity, the singular term "processor" or "computer" may be used in the description of the examples described in this application, but in other examples multiple processors or computers may be used, or a processor or computer may include multiple processing elements, or multiple types of processing elements, or both. For example, a single hardware component or two or more hardware components may be implemented by a single processor, or two or more processors, or a processor and a controller. One or more hardware components may be implemented by one or more processors, or a processor and a controller, and one or more other hardware components may be implemented by one or more other processors, or another processor and another controller. One or more processors, or a processor and a controller, may implement a single hardware component, or two or more hardware components. A hardware component may have any one or more of different processing configurations, examples of which include a single processor, independent processors, parallel processors, single-instruction single-data (SISD) multiprocessing, single-instruction multiple-data (SIMD) multiprocessing, multiple-instruction single-data (MISD) multiprocessing, and multiple-instruction multiple-data (MIMD) multiprocessing.

Instructions or software to control computing hardware, for example, one or more processors or computers, to implement the hardware components as described above may be written as computer programs, code segments, instructions or any combination thereof, for individually or collectively instructing or configuring the one or more processors or computers to operate as a machine or special-purpose computer to perform the operations that are performed by the hardware components as described above. In one example, the instructions or software include machine code that is directly executed by the one or more processors or computers, such as machine code produced by a compiler. In another example, the instructions or software includes higher-level code that is executed by the one or more processors or computer using an interpreter. The instructions or software may be written using any programming language based on the block diagrams and the flow charts illustrated in the drawings and the corresponding descriptions in the specification, which disclose algorithms for performing the operations that are performed by the hardware components as described above.

The instructions or software to control computing hardware, for example, one or more processors or computers, to implement the hardware components as described above, and any associated data, data files, and data structures, may be recorded, stored, or fixed in or on one or more non-transitory computer-readable storage media. Examples of a non-transitory computer-readable storage medium include read-only memory (ROM), random-access memory (RAM), flash memory, CD-ROMs, CD-Rs, CD+Rs, CD-RWs, CD+RWs, DVD-ROMs, DVD-Rs, DVD+Rs, DVD-RWs, DVD+RWs, DVD-RAMs, BD-ROMs, BD-Rs, BD-R LTHs, BD-REs, magnetic tapes, floppy disks, magneto-optical data storage devices, optical data storage devices, hard disks, solid-state disks, and any other device that is configured to store the instructions or software and any associated data, data files, and data structures in a non-transitory manner and provide the instructions or software and any associated data, data files, and data structures to one or more processors or computers so that the one or more processors or computers can execute the instructions. In one example, the instructions or software and any associated data, data files, and data structures are distributed over network-coupled computer systems so that the instructions and software and any associated data, data files, and data structures are stored, accessed, and executed in a distributed fashion by the one or more processors or computers.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An envelope tracking (ET) bias circuit comprising:
a detection circuit comprising a first input terminal configured to receive an ET operation voltage and a second input terminal configured to a radio frequency (RF) signal,
wherein the detection circuit is configured to select either the ET operation voltage input through the first input terminal or an envelope of an RF signal detected from the RF signal input through the second input terminal, in response to a VCC control signal and an RF control signal of a first control signal, and output the selected one of the ET operation voltage and the envelope as a detection signal;
an amplification circuit configured to amplify the detection signal, and output the amplified detection signal; and
a bias output circuit configured to generate an ET bias current based on the amplified signal, and output the generated ET bias current.

2. The envelope tracking bias circuit of claim 1, wherein the detection circuit comprises:
an ET VCC detection circuit configured to amplify the ET operation voltage input through the first input terminal, and output the amplified ET operation voltage in response to the VCC control signal of the first control signal; and
an RF envelope detection circuit configured to detect an envelope of the RF signal input through the second input terminal, and output the envelope in response to the RF control signal of the first control signal.

3. The envelope tracking bias circuit of claim 2, wherein the ET VCC detection circuit comprises an inverting amplification circuit configured to inversely amplify the ET operation voltage input through the first input terminal, and switch on and off an output of the inversely amplified ET operation voltage from the ET VCC detection circuit in response to a first VCC control signal of the VCC control signal.

4. The envelope tracking bias circuit of claim 2, wherein the ET VCC detection circuit comprises:
a first attenuator connected to the first input terminal and configured to attenuate the ET operation voltage input through the first input terminal to be within a predetermined voltage range, and output the attenuated ET operation voltage;
a first inverting amplification circuit configured to inversely amplify the attenuated ET operation voltage, and switch on and off an output of the inversely amplified attenuated ET operation voltage from the ET VCC detection circuit in response to a first VCC control signal of the VCC control signal; and
a second non-inverting amplification circuit configured to non-inversely amplify the attenuated ET operation voltage, and switch on and off an output of the non-inversely amplified attenuated ET operation voltage from the ET VCC detection circuit in response to a second VCC control signal of the VCC control signal.

5. The envelope tracking bias circuit of claim 2, wherein the ET VCC detection circuit comprises:
a first inverting amplification circuit configured to inversely amplify the ET operation voltage input through the first input terminal, and switch on and off an output of the inversely amplified ET operation voltage from the ET VCC detection circuit in response to a first VCC control signal of the VCC control signal; and
a buffer circuit configured to buffer a reference operation voltage, and switch on and off an output of the buffered reference operation voltage from the ET VCC detection circuit in response to a second VCC control signal of the VCC control signal.

6. The envelope tracking bias circuit of claim 2, wherein the RF envelope detection circuit comprises:
a rectifying circuit comprising a negative rectifying circuit configured to detect a negative envelope of the RF signal input through the second input terminal, and output the negative envelope; and
a buffer circuit comprising a first buffered switch circuit configured to buffer the negative envelope, and switch on and off an output of the buffered negative envelope from the RF envelope detection circuit in response to a first RF control signal of the RF control signal.

7. The envelope tracking bias circuit of claim 2, wherein the RF envelope detection circuit comprises:
a rectifying circuit comprising:
a negative rectifying circuit configured to detect a negative envelope of the RF signal input through the second input terminal, and output the negative envelope; and
a positive rectifying circuit configured to detect a positive envelope of the RF signal input through the second input terminal, and output the positive envelope; and
a buffer circuit comprising:
a first buffered switch circuit configured to buffer the negative envelope, and switch on and off an output of the buffered negative envelope from the RF envelope detection circuit in response to a first RF control signal of the RF control signal; and
a second buffered switch circuit configured to buffer the positive envelope, and switch on and off an output of the buffered positive envelope from the RF envelope detection circuit in response to a second RF control signal of the RF control signal.

8. A power amplifying device comprising:
a power amplifier;
a detection circuit comprising a first input terminal configured to receive an envelope tracking (ET) operation voltage and a second input terminal configured to a radio frequency (RF) signal,
wherein the detection circuit is configured to select either the ET operation voltage input through the first input terminal or an envelope of an RF signal detected from the RF signal input through the second input terminal, in response to a VCC control signal and an RF control signal of a first control signal, and output the selected one of the ET operation voltage and the envelope as a detection signal;
an amplification circuit configured to amplify the detection signal, and output the amplified detection signal; and
a bias output circuit configured to generate an ET bias current based on the amplified detection signal, and output the generated ET bias current to the power amplifier.

9. The power amplifying device of claim 8, wherein the detection circuit comprises:
an ET VCC detection circuit configured to amplify the ET operation voltage input through the first input terminal, and output the amplified ET operation voltage in response to the VCC control signal of the first control signal; and
an RF envelope detection circuit configured to detect an envelope of the RF signal input through the second input terminal, and output the envelope in response to the RF control signal of the first control signal.

10. The power amplifying device of claim 9, wherein the ET VCC detection circuit comprises an inverting amplification circuit configured to inversely amplify the ET operation voltage input through the first input terminal, and switch on and off an output of the inversely amplified ET operation voltage from the ET VCC detection circuit in response to a first VCC control signal of the VCC control signal.

11. The power amplifying device of claim 9, wherein the ET VCC detection circuit comprises:
a first attenuator connected to the first input terminal and configured to attenuate the ET operation voltage input through the first input terminal to be within a predetermined voltage range, and output the attenuated ET operation voltage;
a first inverting amplification circuit configured to inversely amplify the attenuated ET operation voltage, and switch on and off an output of the inversely amplified attenuated ET operation voltage from the ET VCC detection circuit in response to a first VCC control signal of the VCC control signal; and
a second non-inverting amplification circuit configured to non-inversely amplify the attenuated ET operation voltage, and switch on and off an output of the non-inversely attenuated amplified ET operation voltage from the ET VCC detection circuit in response to a second VCC control signal of the VCC control signal.

12. The power amplifying device of claim 9, wherein the ET VCC detection circuit comprises:
a first inverting amplification circuit configured to inversely amplify the ET operation voltage input through the first input terminal, and switch on and off an output of the inversely amplified ET operation voltage from the ET VCC detection circuit in response to a first VCC control signal of the VCC control signal; and
a buffer circuit configured to buffer a reference operation voltage, and switch on and off an output of the buffered reference operation voltage from the ET VCC detection circuit in response to a second VCC control signal of the VCC control signal.

13. The power amplifying device of claim 9, wherein the RF envelope detection circuit comprises:
a rectifying circuit comprising a negative rectifying circuit configured to detect a negative envelope of the RF signal input through the second input terminal, and output the negative envelope; and
a buffer circuit comprising a first buffered switch circuit configured to buffer the negative envelope, and switch on and off an output of the buffered negative envelope from the RF envelope detection circuit in response to a first RF control signal of the RF control signal.

14. The power amplifying device of claim 9, wherein the RF envelope detection circuit comprises:
a rectifying circuit comprising:
a negative rectifying circuit configured to detect a negative envelope of the RF signal input through the second input terminal, and output the negative envelope; and
a positive rectifying circuit configured to detect a positive envelope of the RF signal input through the second input terminal, and output the positive envelope; and
a buffer circuit comprising:
a first buffered switch circuit configured to buffer the negative envelope, and switch on and off an output of the buffered negative envelope from the RF envelope detection circuit in response to a first RF control signal of the RF control signal; and
a second buffered switch circuit configured to buffer the positive envelope, and switch on and off an output of the buffered positive envelope from the RF envelope detection circuit in response to a second RF control signal of the RF control signal.

15. A bias circuit comprising:
a detection circuit configured to
receive a radio frequency (RF) signal and an operation voltage,
generate a characteristic signal based on a characteristic of the RF signal, and
output the operation voltage or the characteristic signal as the detection signal in response to a VCC control signal and an RF control signal of a control signal; and
a bias output circuit configured to generate a bias signal based on the detection signal,
wherein the operation voltage is output as the detection signal in response to the control signal having a first value, and
wherein the characteristic signal is output as the detection signal in response to the control signal having a second value different from the first value.

16. The bias circuit of claim 15, wherein the operation voltage depends on the characteristic of the RF signal.

17. The bias circuit of claim 15, wherein the RF signal is an RF input signal of a power amplifier or an RF output signal of the power amplifier;
the operation voltage is an envelope tracking (ET) operation voltage of the power amplifier that tracks an envelope of the RF input signal or an envelope of the RF output signal;
the characteristic signal is an envelope of the RF signal; and
the bias output circuit is further configured to
generate an ET bias signal as the bias signal based on the detection signal, and
output the ET bias signal to the power amplifier as a bias signal of the power amplifier.

18. A bias circuit comprising:
a detection circuit configured to
receive a radio frequency (RF) signal and an operation voltage related to the RF signal,
generate a time-varying signal based on the RF signal, and
output the operation voltage or the time-varying signal as a detection signal in response to a VCC control signal and an RF control signal of a control signal;
an amplification circuit configured to amplify the detection signal; and
a bias output circuit configured to generate a bias signal based on the amplified detection signal,
wherein the detection signal is output as a differential signal in response to the control signal having a first value corresponding to the amplification circuit having a differential structure, and
wherein the detection signal is output as a single-ended signal in response to the control signal having a second value corresponding to the amplification circuit having a single-ended structure, the second value being different from the first value.

19. The bias circuit of claim 18, wherein the detection circuit is further configured to
output the operation voltage as the detection signal in response to the control signal having a first value, and output the time-varying signal as the detection signal in response to the control signal having a second value different from the first value.

20. The bias circuit of claim 18, wherein the RF signal is an RF input signal of a power amplifier or an RF output signal of the power amplifier;

the operation voltage is an envelope tracking (ET) operation voltage of the power amplifier that tracks an envelope of the RF input signal or an envelope of the RF output signal;

the time-varying signal is an envelope of the RF signal; and the bias output circuit is further configured to generate an ET bias signal as the bias signal based on the detection signal, and output the ET bias signal to the power amplifier as a bias signal of the power amplifier.

* * * * *